(12) United States Patent
Zhou

(10) Patent No.: US 10,909,907 B2
(45) Date of Patent: Feb. 2, 2021

(54) PIXEL CIRCUIT, DRIVING METHOD, PIXEL STRUCTURE AND DISPLAY PANEL

(71) Applicant: EverDisplay Optronics (Shanghai) Co., Ltd., Shanghai (CN)

(72) Inventor: Xingyu Zhou, Shanghai (CN)

(73) Assignee: Everdisplay Optronics (Shanghai) Co., Ltd, Shanghai (CN)

( * ) Notice: Subject to any disclaimer, the term of this patent is extended or adjusted under 35 U.S.C. 154(b) by 113 days.

(21) Appl. No.: 16/027,730

(22) Filed: Jul. 5, 2018

(65) Prior Publication Data

US 2019/0213944 A1 Jul. 11, 2019

(30) Foreign Application Priority Data

Jan. 5, 2018 (CN) .......................... 2018 1 0011945

(51) Int. Cl.
*G09G 3/32* (2016.01)
*H01L 27/12* (2006.01)
*G09G 3/3233* (2016.01)

(52) U.S. Cl.
CPC ............. *G09G 3/32* (2013.01); *G09G 3/3233* (2013.01); *H01L 27/124* (2013.01); *H01L 27/1255* (2013.01); *G09G 2300/0439* (2013.01); *G09G 2300/0814* (2013.01);
(Continued)

(58) Field of Classification Search
USPC ........................................................ 345/55
See application file for complete search history.

(56) References Cited

U.S. PATENT DOCUMENTS

2006/0082524 A1* 4/2006 Kwon .................. G09G 3/3233
345/76
2008/0150846 A1* 6/2008 Chung ................. G09G 3/3233
345/80
(Continued)

FOREIGN PATENT DOCUMENTS

| CN | 1744774 A | 3/2006 |
| CN | 102314829 A | 1/2012 |
| CN | 103000127 A | 3/2013 |

(Continued)

OTHER PUBLICATIONS

The CN1OA issued Apr. 24,2019 by the CNIPA.

*Primary Examiner* — Amr A Awad
*Assistant Examiner* — Jonathan G Cooper
(74) *Attorney, Agent, or Firm* — Yunling Ren

(57) ABSTRACT

The present disclosure provides a pixel circuit, a driving method, pixel structure and display panel. A driving unit of the pixel circuit includes an isolating transistor, driving transistor and light emitting control transistor coupled between an external power supply and light emitting unit in series with source and drain electrodes. Both gates of the light emitting control transistor and isolating transistor receive a first control signal, and the driving transistor and compensating transistor are transistors with common gate region. The driving transistor is used to generate a driving current to drive the light emitting unit to emit light when the isolating transistor and light emitting control transistor are turned on under the control of the first control signal, and the driving current is obtained according to the first voltage, a voltage of the external power supply, and a threshold voltage of the driving transistor in the driving unit.

15 Claims, 14 Drawing Sheets

(52) U.S. Cl.
CPC ........... *G09G 2300/0819* (2013.01); *G09G 2310/0264* (2013.01); *G09G 2320/0233* (2013.01)

(56) References Cited

U.S. PATENT DOCUMENTS

| | | | |
|---|---|---|---|
| 2018/0108773 A1* | 4/2018 | Hao | G02F 1/133555 |
| 2018/0158837 A1* | 6/2018 | Lee | G02F 1/13458 |

FOREIGN PATENT DOCUMENTS

| | | | |
|---|---|---|---|
| CN | 204680360 U | | 9/2015 |
| CN | 107038987 A | | 8/2017 |
| CN | 107068045 A | | 8/2017 |
| KR | 2005/0049686 | * | 1/2006 |

\* cited by examiner

S801 in a data writing stage, controlling the first scanning signal to turn on the compensating unit so that the compensating unit sets the voltage of the first node to the first voltage, and controlling the first control signal to turn off the isolating transistor and the light emitting control transistor so that the light emitting unit does not emit light, and the capacitor maintains the voltage of the first node at the first voltage, wherein the first voltage is obtained by compensating for the voltage of the data signal through the compensating transistor in the compensating unit

S802 in a light emitting stage, controlling the first scanning signal to turn off the compensating unit, and controlling the first control signal to turn on the insolating transistor and the light emitting transistor, so that the driving transistor generates a driving current to drive the light emitting unit to emit light, wherein the driving current is obtained according to the first voltage, the voltage of the external power supply and the threshold voltage of the driving transistor, and the capacitor is in a maintaining state

Fig.8

PIXEL CIRCUIT, DRIVING METHOD, PIXEL STRUCTURE AND DISPLAY PANEL

CROSS-REFERENCE

The present application is based upon and claims priority to Chinese Patent Application No. 201810011945.1, filed on Jan. 5, 2018, and the entire contents thereof are incorporated herein by reference.

TECHNICAL FIELD

The present disclosure relates to the technical field of electronic display, and in particular, to a pixel circuit, a driving method, a pixel structure and a display panel.

BACKGROUND

In a conventional pixel circuit, a thin film transistor is generally used to drive a light emitting diode in a pixel circuit to emit light. Such thin film transistor is referred to as a driving transistor. The driving transistor is operated in a saturated state, because the driving current output from the driving transistor in the saturated state is less sensitive to the source-drain voltage than that output from the driving transistor in a linear state, and thus the driving transistor can provide the light emitting diode with a more stable driving current. FIG. 1 shows a basic pixel circuit in the prior art. As shown in FIG. 1, the pixel circuit includes transistors T11 and T12 and a capacitor C11. When the transistor T12 is controlled to be turned on according to signal Sn, data signal Data is written to a node N1 so that the capacitor C11 is charged and at the same time the driving transistor T11 is turned on. A light emitting diode EL11 between a first power supply ELVDD and a second power supply ELVSS emits light according to the driving current generated by the transistor T11. The driving current is shown in the following Equation I.

$$I_{EL} = \frac{1}{2}\mu C_{OX}\frac{W}{L}(V_{GS}+V_{TH})^2 \qquad \text{Equation I}$$

In the above Equation I, p represents the carrier mobility, $C_{ox}$ represents the unit-area capacitance of gate oxide, L represents the channel length of the transistor T11, W represents the gate width of the transistor T11, $V_{GS}$ represents the gate-source voltage of the transistor T11, and $V_{TH}$ represents the threshold voltage of the transistor T11. It can be seen from the Equation I that, the magnitude of the driving current is related to the threshold voltage of the transistor T11. However, since there is a phenomenon of threshold voltage drift, the threshold voltage of the driving transistor T11 is not stable, which results in a driving current shift and thereby an uneven luminance of the light emitting diode.

In order to solve the above problem, designers have developed a series of circuits, which may eliminate the influence of the threshold voltage drift of the driving transistor and are referred to as threshold compensating circuits. FIG. 2 shows a conventional threshold compensating circuit. As shown in FIG. 2, in a data writing stage, transistors T22 and T23 are turned on according to signal Sn so that the gate and the drain electrode of the driving transistor T21 are in a short-circuited connection state. At the same time, a transistor T25 is turned off according to signal En, and a transistor T24 is turned off according to signal Sn−1, so that the data signal Data is transmitted to the source electrode of the transistor T21 through the transistor T22. Since the gate and the drain electrode of the transistor T21 are in a short-circuited connection state, the data signal is transmitted to the gate of the transistor T21 via the drain electrode thereof, and a capacitor C21 starts being charged, so that the gate voltage of the transistor T22 gradually decreases to $(V_{data}+V_{TH})$, and then the transistor T21 is turned off and the capacitor C21 stops being charged. In a light emitting stage, the transistor T25 is controlled to be turned on according to the signal En, the transistor T24 is turned off according to the signal Sn−1, and the transistors T22 and T23 are turned off according to the signal Sn, so that the power supply ELVDD is transmitted to the driving transistor T21 through the transistor T25. At this time, the driving transistor generates a driving current as shown in the following Equation 2.

$$I_{EL} = \frac{1}{2}\mu C_{OX}\frac{W}{L}(V_{ELVDD}-V_{data})^2 \qquad \text{Equation II}$$

It can be seen from the above Equation II that, the magnitude of the driving current is no longer related to the threshold voltage of the driving transistor T21.

However, in the conventional threshold compensating circuit represented by FIG. 2, in the data writing stage, only the transistor T25 is interposed between the power supply ELVDD and the data signal. Since the voltage of the power supply ELVDD is much larger other signal voltages and the transistor T25 has a leakage current, the data signal may be easily affected by the power supply ELVDD, which may then affect the light emitting stability of the light emitting diode.

Based on the above, in the related art, there is a problem that the light emission of the light emitting diode is unstable.

SUMMARY

The embodiments of the present disclosure provide a pixel circuit, including a compensating unit, a driving unit, a light emitting unit, a capacitor, and an external power supply, wherein, the compensating unit is electrically coupled to the driving unit through a first node, the external power supply, the driving unit and the light emitting unit are coupled in series sequentially, and the capacitor is coupled between the first node and the external power supply;

the compensating unit is configured to receive a data signal and a first scanning signal, and to set a voltage of the first node to a first voltage under the control of the first scanning signal, wherein the first voltage is obtained by compensating for a voltage of the data signal through a compensating transistor in the compensating unit;

the capacitor is configured to maintain the voltage of the first node at the first voltage;

the driving unit comprises an isolating transistor, a driving transistor and a light emitting control transistor coupled between the external power supply and the light emitting unit in series sequentially through their source and drain electrodes;

both gates of the light emitting control transistor and the isolating transistor receive a first control signal, and the driving transistor and the compensating transistor are transistors with common gate region; and the driving transistor is configured to generate a driving current to drive the light emitting unit to emit light when the isolating transistor and the light emitting control transistor are turned on under the control of the first control signal, wherein the driving current is obtained according to the first voltage, a voltage of the external power supply, and a threshold voltage of the driving transistor in the driving unit.

In an embodiment, the compensating unit further includes a data strobe transistor, and the data strobe transistor includes a first electrode receiving the data signal, a second electrode electrically coupled to a first electrode of the compensating transistor, and a gate electrically coupled to the first scanning signal.

In an embodiment, the compensating unit further includes a switching transistor, and the switching transistor includes a first electrode electrically coupled to a second electrode of the compensating transistor, a second electrode electrically coupled to a gate of the compensating transistor, and a gate electrically coupled to the first scanning signal.

In an embodiment, the pixel circuit further includes an initializing unit coupled between the first node and the light emitting unit, wherein the initializing unit is configured to receive a second scanning signal and an initializing signal, and to initialize the first node and the light emitting unit with the initializing signal under the control of the second scanning signal.

The embodiments of the present disclosure provide a driving method of a pixel circuit, which is applied to any one of the above pixel circuits and includes:

in a data writing stage, controlling the first scanning signal to turn on the compensating unit so that the compensating unit sets the voltage of the first node to the first voltage, and controlling the first control signal to turn off the isolating transistor and the light emitting control transistor so that the light emitting unit does not emit light, and the capacitor maintains the voltage of the first node at the first voltage, wherein the first voltage is obtained by compensating for the voltage of the data signal through the compensating transistor in the compensating unit; and in a light emitting stage, controlling the first scanning signal to turn off the compensating unit, and controlling the first control signal to turn on the insolating transistor and the light emitting transistor, so that the driving transistor generates a driving current to drive the light emitting unit to emit light, wherein the driving current is obtained according to the first voltage, the voltage of the external power supply and the threshold voltage of the driving transistor, and the capacitor is in a maintaining state.

In an embodiment, the method further includes before the data writing stage:

in an initializing stage, controlling the second scanning signal to turn on the initializing unit, so that the initializing unit initializes the first node and the light emitting unit with an initializing voltage and the capacitor maintains the initializing voltage, controlling the first scanning signal to turn off the compensating unit, and controlling the first control signal to turn off the driving unit.

In an embodiment, the method further includes:

in the data writing stage, controlling the second scanning signal to turn off the initializing unit; and in the light emitting stage, controlling the second scanning signal to turn off the initializing unit.

The embodiments of the present disclosure provides a pixel structure of any one of the above pixel circuits, including:

a first electrode region, a second electrode region, a third electrode region and a fourth electrode region disposed separately, a common gate region in contact with the first electrode region, the second electrode region, the third electrode region and the fourth electrode region respectively, a third electrode extending region extending from the third electrode region, and a fourth electrode extending region extending from the fourth electrode region, wherein, the common gate region, the first electrode region and the second electrode region form the compensating transistor, the common gate region, the third electrode region and the fourth electrode region form the driving transistor, an overlapping region of the third electrode extending region and a first control signal line forms a gate region of the isolating transistor, and a side of the third electrode extending region away from the common gate region is coupled to an external power supply line, an overlapping region of the fourth electrode extending region and the first control signal line forms a gate region of the light emitting control transistor, and a side of the fourth electrode extending region away from the common gate region is coupled to the light emitting unit.

In an embodiment, a metal plate is disposed above the common gate region, and used as one of capacitance plates of the capacitor.

In an embodiment, the pixel structure further includes a first electrode extending region extending from the first electrode region, an overlapping region of the first electrode extending region and the first scanning signal line forms a gate region of the data strobe transistor, and a side of the first electrode extending region away from the common gate region is coupled to a data signal line.

In an embodiment, the pixel structure further includes a second electrode extending region extending from the second electrode region, an overlapping region of the second electrode extending region and the first scanning signal line forms a gate region of the switching transistor, and a side of the second electrode extending region away from the common gate region is electrically coupled to the common gate region.

The embodiments of the present disclosure provide a display panel including any one of the above pixel structures.

BRIEF DESCRIPTION OF THE DRAWINGS

In order to more clearly illustrate the technical solution of the embodiments of the present disclosure, the following drawings, which are to be used in the description of the embodiments, will be briefly described. It will be apparent that the drawings described in the following description refer only to some embodiments of the present disclosure, and other drawings may be obtained according to those drawings by those skilled in the art without creative efforts.

FIG. 8 is a schematic flow chart of a driving method of a pixel circuit provide by an embodiment of the present disclosure;

DETAILED DESCRIPTION

To make the objectives, technical solutions, and advantages of the present disclosure clearer, the present disclosure will be further described in detail below with reference to the accompanying drawings. Obviously, the described embodiments are merely some but not all of the embodiments of the present disclosure. All other embodiments obtained by those skilled in the art based on the embodiments of the present disclosure without creative efforts shall fall within the protection scope of the present disclosure.

Figure 1:
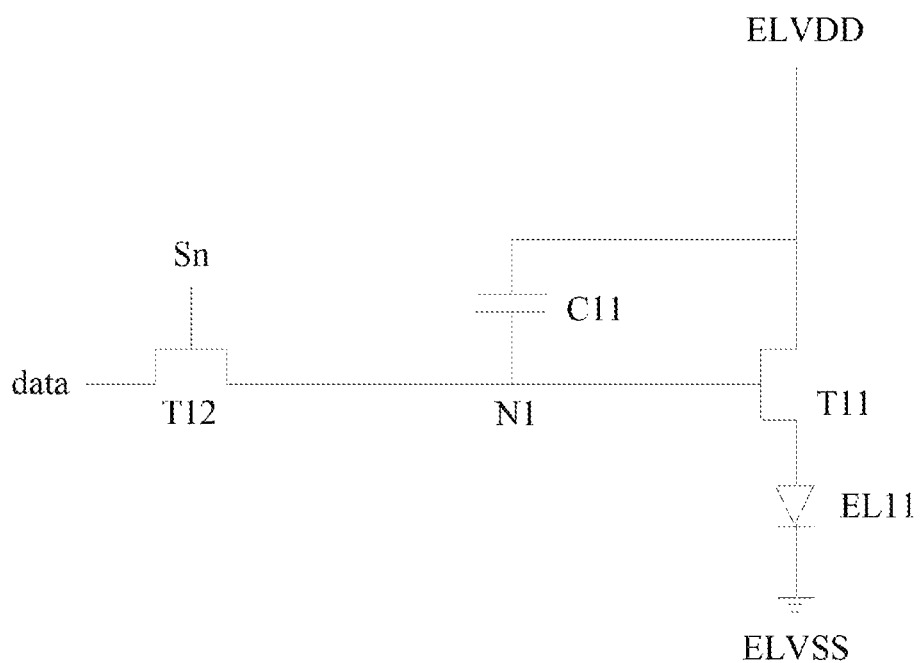
FIG. 1 shows a conventional basic pixel circuit.
Figure 2:
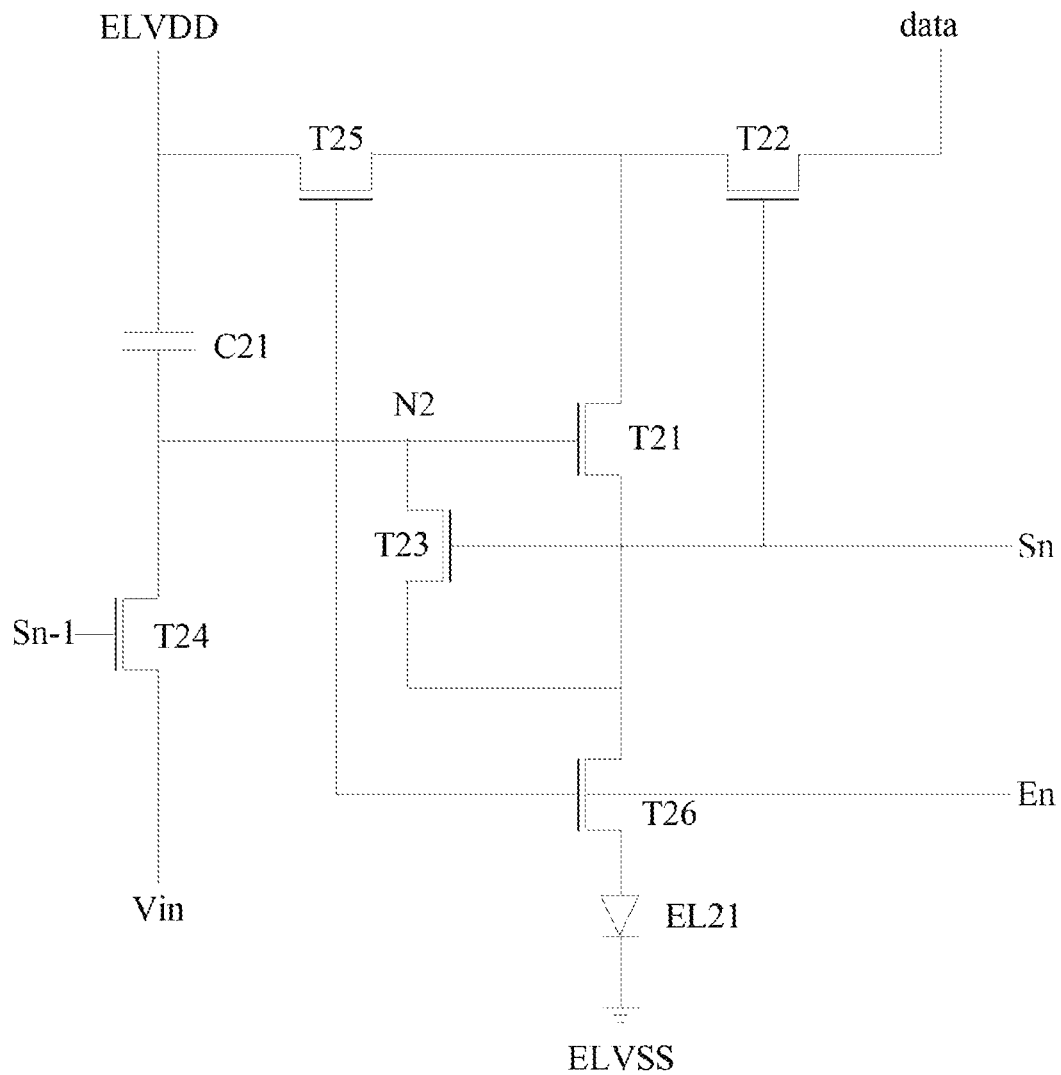
FIG. 2 shows a conventional threshold compensating circuit.
Figure 3:
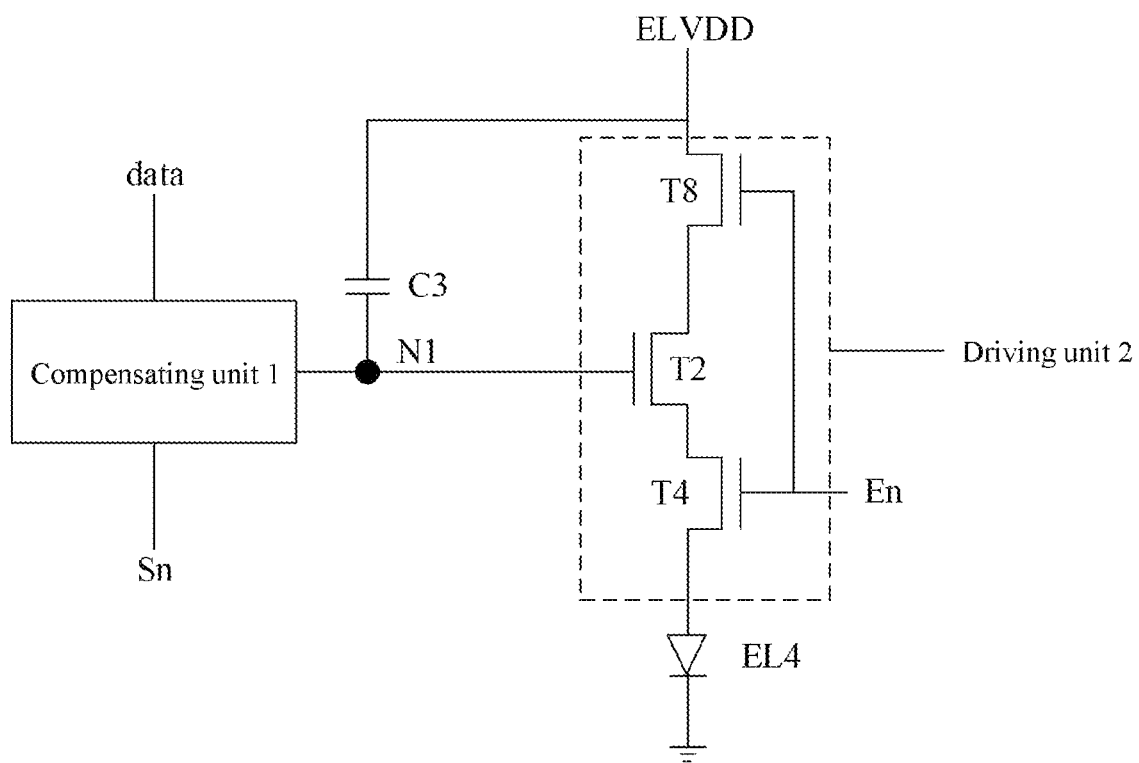
FIG. 3 is a schematic structure diagram of a pixel circuit provided by an embodiment of the present disclosure.

The embodiments of the present disclosure provide a pixel circuit. The pixel circuit includes a compensating unit, a driving unit, a light emitting unit, a capacitor, and an external power supply. The compensating unit is electrically coupled to the driving unit through a first node, the external power supply, the driving unit and the light emitting unit are coupled in series sequentially, and the capacitor is coupled between the first node and the external power supply. The compensating unit is used to receive a data signal and a first scanning signal, and to set a voltage of the first node to a first voltage under the control of the first scanning signal, and the first voltage is obtained by compensating for a voltage of the data signal through a compensating transistor in the compensating unit. The capacitor is used to maintain the voltage of the first node at the first voltage. The driving unit includes an isolating transistor, a driving transistor and a light emitting control transistor coupled between the external power supply and the light emitting unit in series sequentially through their source and drain electrodes. Both gates of the light emitting control transistor and the isolating transistor receive a first control signal, and the driving transistor and the compensating transistor are transistors with common gate region. The driving transistor is used to generate a driving current to drive the light emitting unit to emit light when the isolating transistor and the light emitting control transistor are turned on under the control of the first control signal, and the driving current is obtained according to the first voltage, a voltage of the external power supply, and a threshold voltage of the driving transistor in the driving unit. FIG. 3 is a schematic structure diagram of a pixel circuit provided by an embodiment of the present disclosure. As shown in FIG. 3, the pixel circuit includes a compensating unit 1, a driving unit 2, a capacitor c3, a light emitting unit EL4, and an external power supply ELVDD. The compensating unit 1 is electrically coupled to the driving unit 2 through a first node N1, the external power supply ELVDD, the driving unit 2 and the light emitting unit EL4 are coupled in series sequentially, and the capacitor C3 is coupled between the first node N1 and the external power supply ELVDD. The compensating unit 1 is used to receive a data signal Data and a first scanning signal Sn, and to set a voltage of the first node N1 to a first voltage, that is, ($V_{data}+V_{thT1}$), under the control of the first scanning signal Sn, wherein the $V_{thT1}$ represents a threshold voltage of a compensating transistor in the compensating unit 1. The capacitor C3 is used to maintain the voltage of the first node N1 at the first voltage ($V_{data}+V_{thT1}$). The driving unit 2 includes an isolating transistor T8, a driving transistor T2 and a light emitting control transistor T4 coupled between the external power supply ELVDD and the light emitting unit EL4 in series sequentially through their source and drain electrodes. Both gates of the light emitting control transistor T4 and the isolating transistor T8 receive a first control signal En, and the driving transistor T2 and the compensating transistor in the compensating unit 1 are transistors with common gate region, that is, the driving transistor T2 and the compensating transistor share the same gate region. The driving transistor T2 is used to generate a driving current to drive the light emitting unit EL4 to emit light when the isolating transistor T8 and the light emitting control transistor T4 are turned on under the control of the first control signal En, and the driving current is obtained according to the first voltage, a voltage of the external power supply ELVDD, and a threshold voltage of the driving transistor T2. In this case, it can be obtained from the Equation I that the magnitude of the driving current $I_{EL4}$ passing through the light emitting unit EL4 may be represented by the following Equation III.

$$I_{EL4} = \frac{1}{2}\mu C_{OX}\frac{W}{L}(V_{ELVDD} - V_{N1} + V_{thT2})^2 \qquad \text{Equation III}$$

In the above Equation III, $V_{ELVDD}$ represents the voltage of the external power supply ELVDD. $V_{N1}$ represents the first voltage, $V_{thT2}$ represents the threshold voltage of the driving transistor. Since the drive transistor and the compensating transistor are the common-gate region transistors, the threshold voltage of the drive transistor is almost the same as that of the compensating transistor T1, i.e., $V_{thT1}-V_{thT2}$=A and A is a constant close to zero. Thus, the Equation III may be modified into the following Equation IV.

$$I_{EL} = \frac{1}{2}\mu C_{OX}\frac{W}{L}(V_{ELVDD} - V_{data} - A)^2 \qquad \text{Equation IV}$$

Therefore, the influence of the threshold current of the driving transistor on the light emitting diode is eliminated. In addition, in the pixel circuit shown in FIG. 3, the data signal Data is transmitted to the compensating unit 1, and the external power supply ELVDD is coupled to the driving unit 2, so that in the data writing stage, the data signal Data is written into the first node N1 by the compensating unit 1, and in the light emitting stage, the external power supply ELVDD is coupled to the driving unit 2, and the data signal Data and the external power supply ELVDD are isolated from each other, thereby avoiding the effect of the external power supply ELVDD on the data signal Data and improving the light emitting stability of the light emitting transistor. At the same time, due to the isolating transistor T8, even if the compensating transistor and the driving transistor T2 are the common-gate region transistors, the data signal Data will not be affected by the external power supply ELVDD in the common-gate region during data writing, which further improves the light emitting stability of the light emitting transistor. As for the specific implementation, the structure of the compensating unit 1 is not specifically limited in the embodiment of the present disclosure, and the pixel circuit that satisfies the functions and interaction relationships of the compensating unit 1 in the above embodiments should be included in the embodiment of the present disclosure.

In an embodiment, the driving transistor and the compensating transistor are mirror transistors, both of which have the same threshold voltage, i.e., $V_{thT1}=V_{thT2}$. Therefore, the Equation IV may be further simplified into that shown in the Equation II.

Figure 4:
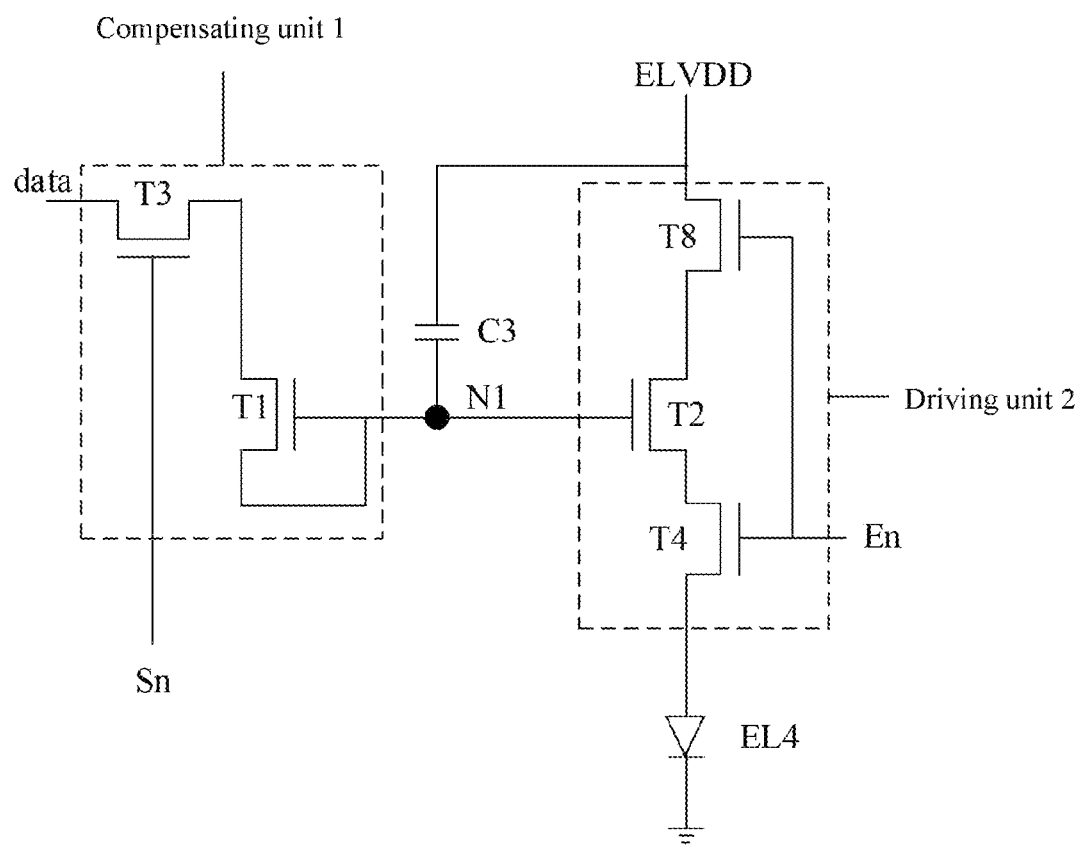
FIG. 4 is a schematic structure diagram of a pixel circuit provided by an embodiment of the present disclosure.
Figure 5:
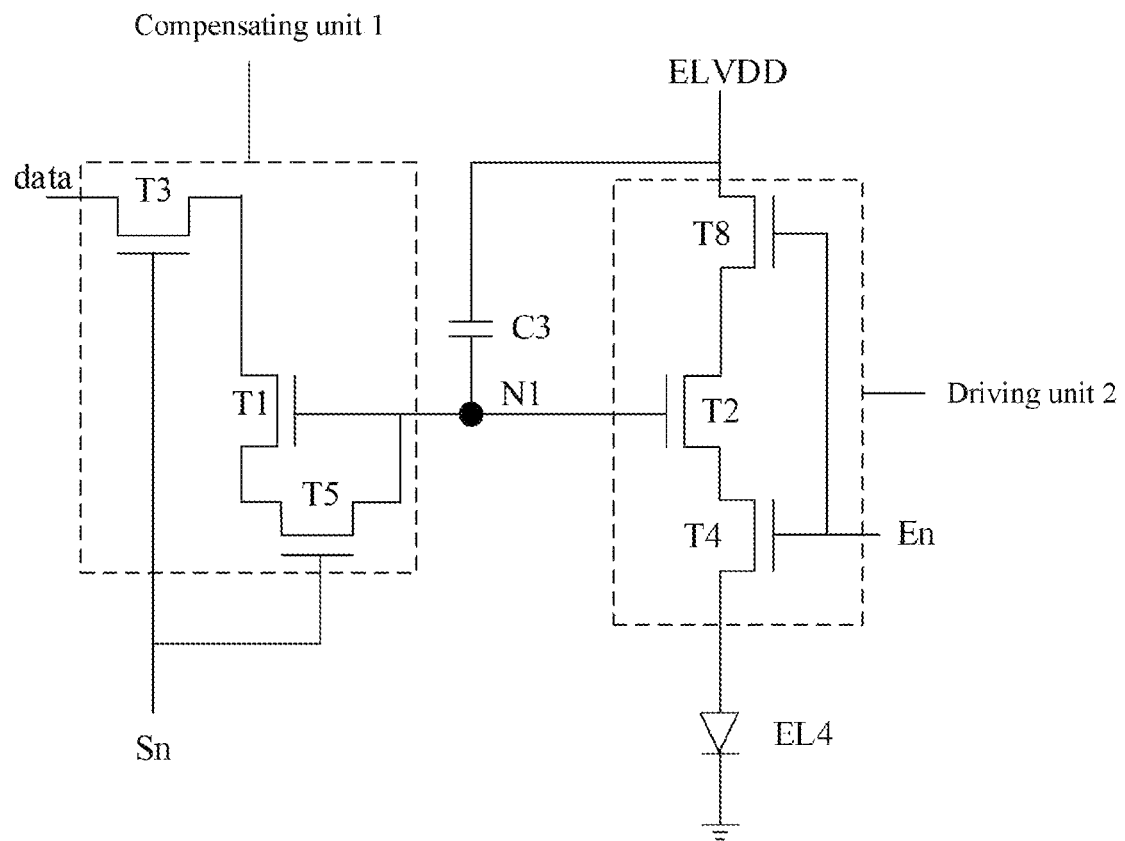
FIG. 5 is a schematic structure diagram of a pixel circuit provided by an embodiment of the present disclosure.

In an embodiment, the compensating unit 1 further includes a data strobe transistor T3. FIG. 4 is a schematic structure diagram of a pixel circuit provided by an embodiment of the present disclosure. As shown in FIG. 4, the data strobe transistor T3 includes a first electrode receiving the data signal Data, a second electrode electrically coupled to a first electrode of the compensating transistor T1, and a gate electrically coupled to the first scanning signal Sn. The data strobe transistor T3 is used to transmit the data signal Data to the compensating transistor T1 under the control of the first scanning signal Sn. In this case, the second electrode of the compensating transistor T1 may be electrically coupled to the gate of the compensating transistor T1, as shown in FIG. 4. In an embodiment, it may be that as shown in FIG. 5, which is a schematic structure diagram of a pixel circuit provided by an embodiment of the present disclosure. In FIG. 5, the compensating unit 1 further includes a switching transistor T5, and the switching transistor T5 includes a first electrode electrically coupled to the second electrode of the compensating transistor T1, a second electrode electrically coupled to the gate of the compensating transistor T1, and a gate electrically coupled to the first scanning signal Sn. The switching transistor T5 is disposed in the compensating unit 1 so that the isolating effect between the data signal Data and the external power supply ELVDD is enhanced, thereby further protecting the data signal Data from being affected by the external power supply ELVDD.

Figure 6:
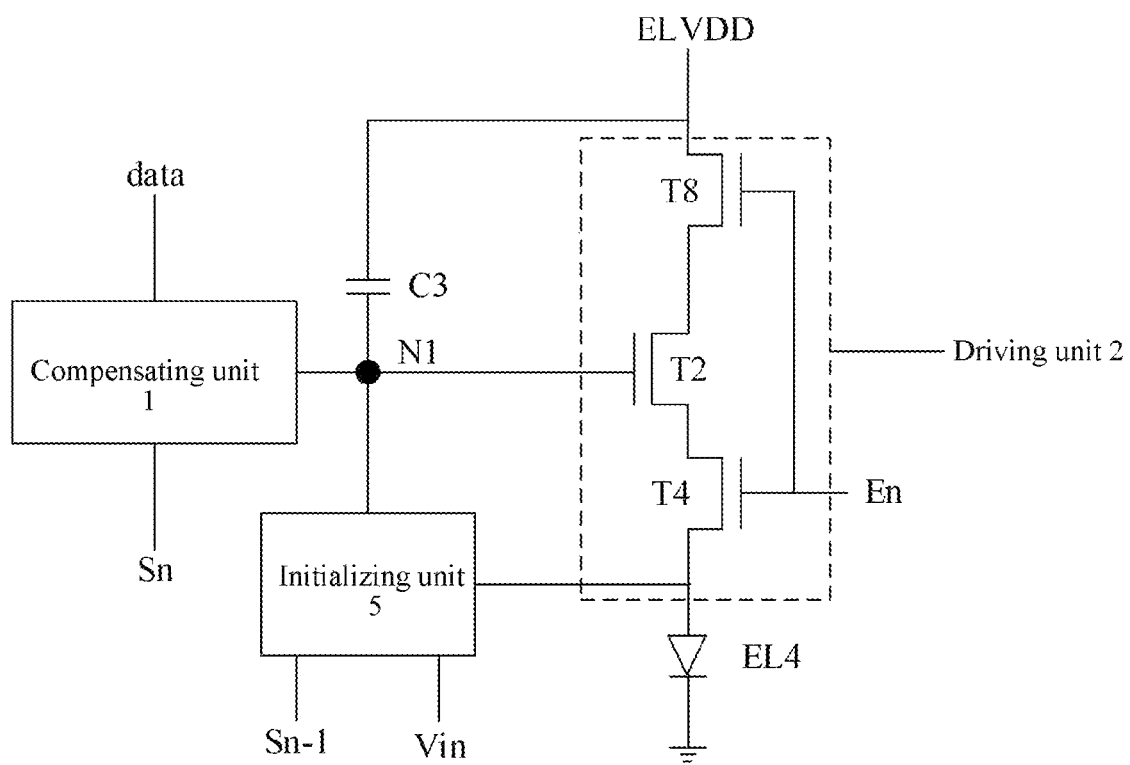
FIG. 6 is a schematic structure diagram of a pixel circuit having an initializing function provided by an embodiment of the present disclosure.

In an embodiment, the pixel circuit provided by an embodiment of the present invention further includes an initializing unit. FIG. 6 is a schematic structure diagram of a pixel circuit having an initializing function provided by an embodiment of the present disclosure. As shown in FIG. 6, an initializing unit 5 is coupled between the first node N1 and the light emitting unit EL4, and receives a second scanning signal Sn−1 and an initializing voltage Vin. When the initializing unit 5 is turned on according to the second scanning signal Sn−1, the initializing unit 5 outputs the initializing voltage to the first node N1 and the light emitting unit EL4, and the capacitor C3 is discharged to the initializing voltage Vin, therefore the first node N1 and the light emitting unit EL4 are initialized. The voltage in the first node N1 may be released by the initializing, which ensures that the data signal may be written into the first node N1 in the following data writing stage. In the embodiment of the present disclosure, the structure of the initializing unit 5 is not specifically limited, and the pixel circuit that satisfies the functions of the initializing unit 5 and the interaction relationships of the initializing unit 5 with the compensating unit 1 and the driving unit 2 in the above embodiments should be included in the embodiment of the present disclosure.

Figure 7:
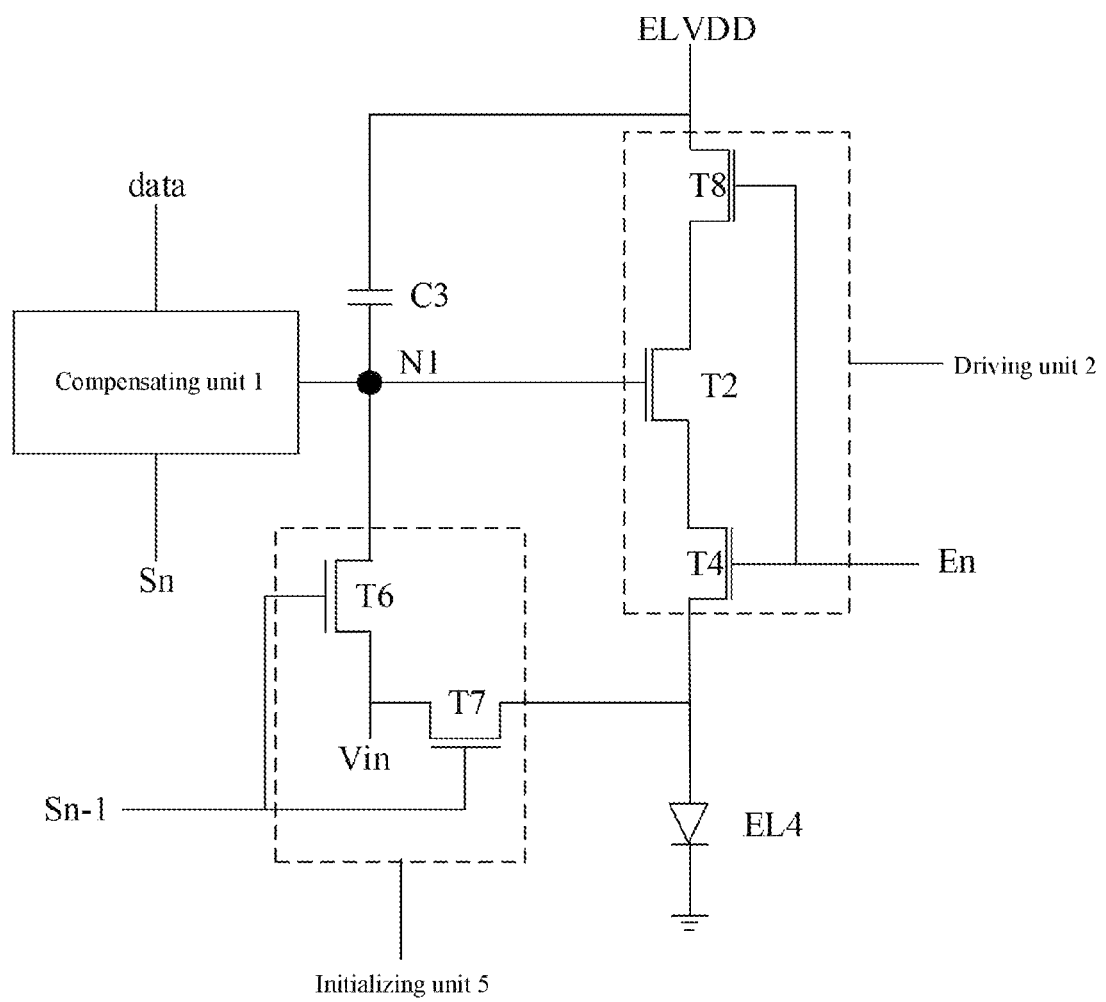
FIG. 7 is a schematic structure diagram of an initializing unit provided by an embodiment of the present disclosure.

In an embodiment, there is provided a feasible implementation manner of the initializing unit. FIG. 7 is a schematic structure diagram of an initializing unit provided by an embodiment of the present disclosure. As shown in FIG. 7, the initializing unit 5 includes a first initializing transistor T6 and a second initializing transistor T7. A first electrode of the first initializing transistor T6 is coupled to an initializing voltage Vin, a second electrode of the first initializing transistor T6 is electrically coupled to the first node N1, and a gate of the first initializing transistor T6 is electrically coupled to the second scanning signal Sn−1. A first electrode of the second initializing transistor T7 is coupled to the initializing voltage Vin, a second electrode of the second initializing transistor T7 is electrically coupled to the light emitting unit EL4, and a gate of the second initializing transistor T7 is electrically coupled to the second scanning signal Sn−1. When the first and second initializing transistors T6 and T7 are turned on according to the second scanning signal Sn−1, the initializing voltage is transmitted to the first node N1 through the first initializing transistor T6 and the first node N1 is initialized, and the initializing voltage is transmitted to the light emitting unit EL4 through the second initializing transistor T7 and the light emitting unit EL4 is initialized. In a specific implementation, the initializing voltage Vin may be a separate initializing signal, or it may be the second scanning signal Sn−1. In the case where the initializing voltage Vin is the second scanning signal, when the first initializing transistor T6 and the second initializing transistor T7 are turned on according to the second scanning signal Sn−1, the first initializing transistor T6 and the second initializing transistor T7 are in a saturated state, and the second scanning signal is input to the first node N1 and the anode of the light emitting unit EL4 through the first initializing transistor T6 and the second initializing transistor T7 respectively, until the first initializing transistor T6 and the second initializing transistor T7 are turned off, so that the initializing of the first node N1 and the light emitting unit EL4 is completed.

Based on the above, the embodiments of the present disclosure provide a pixel circuit. The pixel circuit includes a compensating unit, a driving unit, a light emitting unit, a capacitor, and an external power supply. The compensating unit is electrically coupled to the driving unit through a first node, the external power supply, the driving unit and the light emitting unit are coupled in series sequentially, and the capacitor is coupled between the first node and the external power supply. The compensating unit is used to receive a data signal and a first scanning signal, and to set a voltage of the first node to a first voltage under the control of the first scanning signal, and the first voltage is obtained by compensating for a voltage of the data signal through a compensating transistor in the compensating unit. The capacitor is used to maintain the voltage of the first node at the first voltage. The driving unit includes an isolating transistor, a driving transistor and a light emitting control transistor coupled between the external power supply and the light emitting unit in series sequentially through their source and drain electrodes. Both gates of the light emitting control transistor and the isolating transistor receive a first control signal, and the driving transistor and the compensating transistor are transistors with common gate region. The driving transistor is used to generate a driving current to drive the light emitting unit to emit light when the isolating transistor and the light emitting control transistor are turned on under the control of the first control signal, and the driving current is obtained according to the first voltage, a voltage of the external power supply, and a threshold voltage of the driving transistor in the driving unit. The compensating unit is coupled to the data signal, and the driving unit is coupled to the external power supply, so that in the data writing stage, the data signal is compensated for by the compensating transistor in the compensating unit, and the threshold voltage of the compensating transistor is compensated to the voltage of the data signal to obtain the first voltage. Since the compensating unit is not coupled to the external power supply, the influence of the external power supply on the data signal is avoided. Moreover, the driving transistor and the compensating transistor are common-gate region transistors, both of which have almost the same threshold voltage, and thus the compensating the threshold voltage of the compensating transistor to the voltage of the data signal corresponds to compensating the threshold voltage of the driving transistor to the voltage of the data signal, which ensures the threshold compensating function of the pixel circuit. At the same time, due to the isolating transistor, even if the compensating transistor and the driving transistor are the common-gate region transistors, the data signal will not be affected by the external power supply in the common-gate region during data writing, which further improves the light emitting stability of the light emitting transistor. Therefore, the embodiments of the present disclosure may achieve the threshold compensating function of the pixel circuit while avoiding the influence of the external power supply on the data signal and improving the light-emitting stability of the light emitting diode.

Based on the same technical idea, an embodiment of the present invention further provides a driving method of a pixel circuit. FIG. 8 is a schematic flow chart of a driving method of a pixel circuit provide by an embodiment of the present disclosure. As shown in FIG. 8, the method includes:

S801, in a data writing stage, controlling the first scanning signal to turn on the compensating unit so that the compensating unit sets the voltage of the first node to the first voltage, and controlling the first control signal to turn off the isolating transistor and the light emitting control transistor so that the light emitting unit does not emit light, and the capacitor maintains the voltage of the first node at the first voltage, wherein the first voltage is obtained by compensating for the voltage of the data signal through the compensating transistor in the compensating unit; and S802, in a light emitting stage, controlling the first scanning signal to turn off the compensating unit, and controlling the first control signal to turn on the insolating transistor and the light emitting transistor, so that the driving transistor generates a driving current to drive the light emitting unit to emit light, wherein the driving current is obtained according to the first voltage, the voltage of the external power supply and the threshold voltage of the driving transistor, and the capacitor is in a maintaining state.

Figure 9:
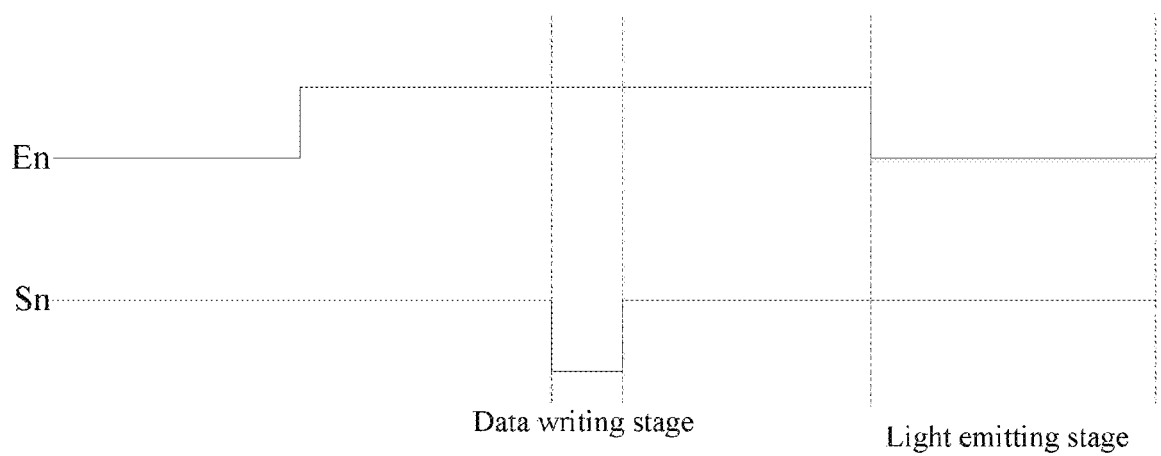
FIG. 9 is a schematic diagram of a driving signal provided by an embodiment of the present disclosure.

In a specific implementation, the above embodiment may drive the pixel circuit as shown in FIG. 3. In an embodiment, the compensating unit 1 and the driving unit 2 are turned on or off by controlling the turning-on of the transistors in the compensating unit 1 and the driving unit 2. At this time, the driving signal corresponding to the pixel circuit shown in FIG. 3 is shown in FIG. 9, which is a schematic diagram of a driving signal provided by an embodiment of the present disclosure. The driving signal in FIG. 9 includes the first scanning signal Sn and the first control signal En. FIG. 9 further discloses the timing of the first scanning signal Sn and the first control signal En when the transistors in the compensating unit 1 and the driving unit 2 in the circuit of FIG. 3 are positive channel metal oxide semiconductor (PMOS) transistors.

In the data writing stage, as shown in FIG. 9, the first scanning signal Sn is at a low level and the compensating unit 1 is turned on. The first control signal En is at a high level, the isolating transistor T8 and the light emitting control transistor T4 are turned off, and the driving unit 2 is turned off. The compensating unit 1 writes the data signal Data to the first node N1, and the capacitor C3 starts being charged until the voltage of the first node N1 is set to the first voltage ($V_{data}+V_{thT1}$). After that, the compensating transistor in the compensating unit 1 is turned off, and the capacitor C3 maintains the voltage of the first node N1 at the first voltage ($V_{data}+V_{thT1}$).

In the light emitting stage, as shown in FIG. 9, the first scanning signal Sn is at a high level, and the compensating unit 1 is turned off. The first control signal En is at a low level, and the driving unit 2 is turned on. The driving unit 2 generates a driving current to drive the light emitting unit EL4 to emit light. Since the voltage of the first node is the first voltage ($V_{data}+V_{thT1}$), the gate voltage of the driving transistor T2 in the driving unit 2 can be compensated by the threshold so that the driving current is no longer affected by the threshold drift of the driving transistor.

Figure 10:
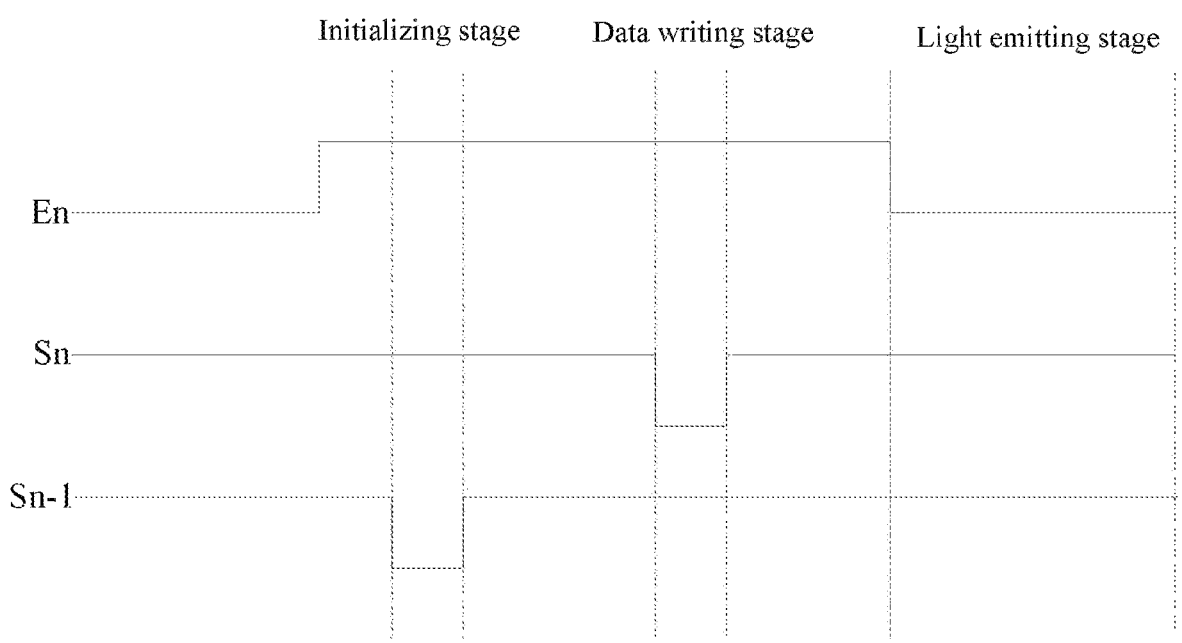
FIG. 10 is a schematic diagram of a driving signal provided by an embodiment of the present disclosure.

An embodiment of the present disclosure further provides another driving method of a pixel circuit, which corresponds to the pixel circuit shown in FIG. 6. FIG. 10 is a schematic diagram of a driving signal provided by an embodiment of the present disclosure. As shown in FIG. 10, the driving signal includes a first scanning signal Sn, a second scanning signal Sn−1, and a first control signal En. In addition, FIG. 10 further discloses the timing of the first scanning signal Sn, the second scanning signal Sn−1, and the first control signal En when the transistors of the compensating unit 1, the driving unit 2 and the initializing unit 5 in the circuit shown in FIG. 6 are PMOS transistors. The method may further include before the data writing stage: in an initializing stage, controlling the second scanning signal Sn−1 to turn on the initializing unit 5, so that the initializing unit 5 initializes the first node N1 and the light emitting unit EL4 with an initializing voltage Vin and the capacitor 3 maintains the initializing voltage Vin, controlling the first scanning signal Sn to turn off the compensating unit 1, and controlling the first control signal En to turn off the insolating transistor T8 and the light emitting control transistor T4 so as to turn off the driving unit 2.

In the data writing stage, as shown in FIG. 10, the first scanning signal Sn is at a low level, the compensating unit 1 is turned on. The first control signal En is at a high level, the isolating transistor T8 and the light emitting control transistor T4 are turned off, and the driving unit 2 is turned off. The second scanning signal Sn−1 is at a high level and the initializing unit is turned off. The compensating unit 1 writes the data signal Data into the first node N1, and the capacitor C3 starts being charged until the voltage of the first node N1 is set to the first voltage ($V_{data}+V_{thT1}$). After that, the compensating transistor in the compensating unit 1 is turned off, and the capacitor C3 maintains the voltage of the first node N1 at the first voltage ($V_{data}+V_{thT1}$).

In the light emitting stage, as shown in FIG. 10, the first scanning signal Sn is at a high level, and the compensating unit 1 is turned off. The second scanning signal Sn−1 is at a high level, and the initialing unit is turned off. The first control signal En is at a low level, the isolating transistor T8 and the light emitting control transistor T4 are turned on, and the driving unit 2 is turned on. The driving unit 2 generates a driving current to drive the light emitting unit EL4 to emit light. Since the voltage of the first node N1 is the first voltage ($V_{data}+V_{thT1}$), the gate voltage of the driving transistor T2 can be compensated by the threshold so that the driving current is no longer affected by the threshold drift of the driving transistor T2.

In order to solve the problem of unstable light emission of the light emitting diode in the related art, the embodiment of the present disclosure is further optimized on the basis of the existing threshold compensating circuit, thereby avoiding the influence of the external power supply on the data signal and making the light emission of the light emitting diode more stable. Several specific implementations are described in detail, which take the PMOS transistor as an example. It should be pointed out that the following variations of specific implementations, such as the NMOS or COMS circuits obtained after the variations, should also fall within the scope of protection of the embodiments of the present disclosure. The present disclosure does not enumerate all the varied pixel circuits one by one, and only some of the pixel circuits are described to explain the technical solutions disclosed in the embodiments of the present disclosure.

Figure 11:
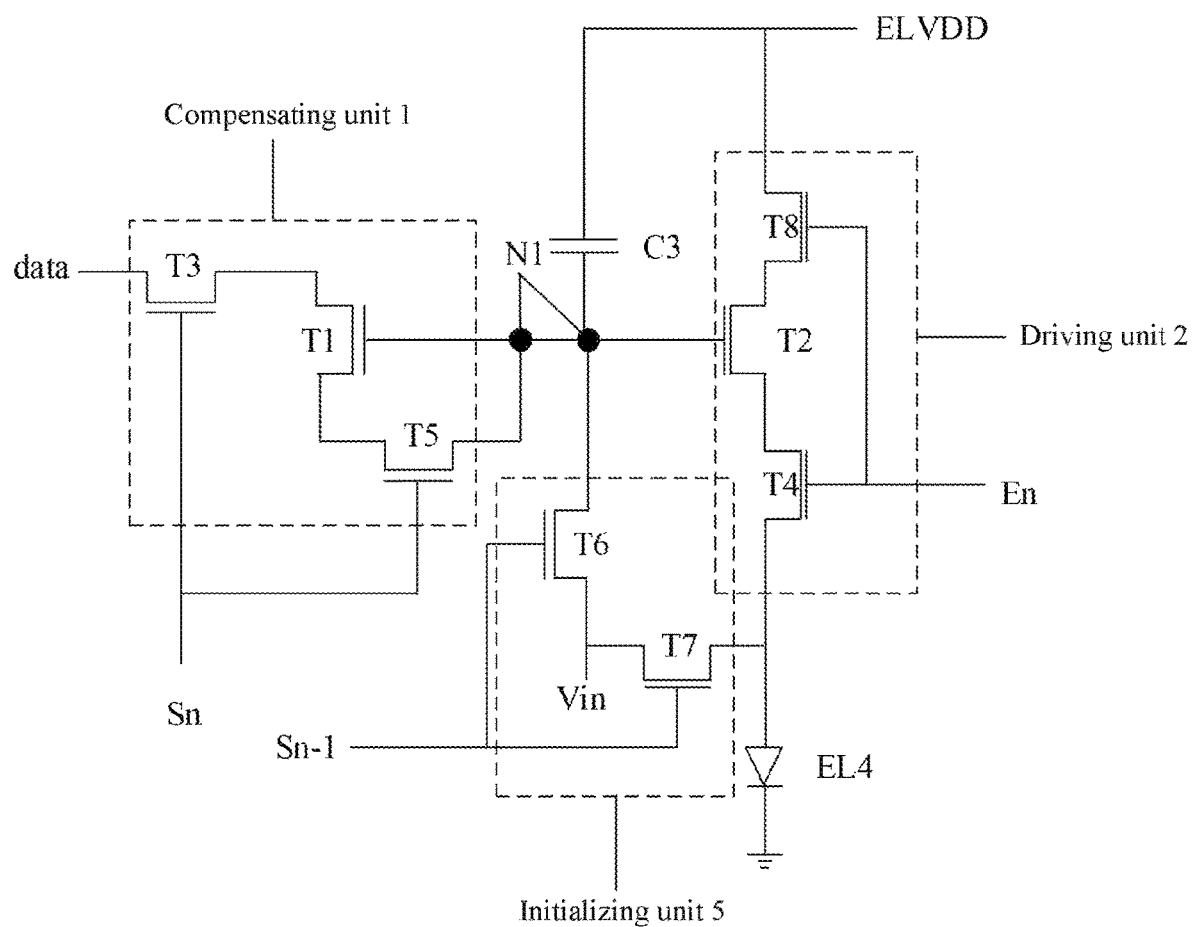
FIG. 11 shows one feasible implementation of a pixel circuit provided by an embodiment of the present disclosure.

FIG. 11 shows one feasible implementation of a pixel circuit provided by an embodiment of the present disclosure. As shown in FIG. 11, the compensating unit includes a data strobe transistor T3, a compensating transistor T1, and a switching transistor T5. The driving unit includes a driving transistor T2 and a light emitting control transistor T4. The initializing unit includes a first initializing transistor T6 and a second initialing transistor T7.

In the compensating unit, the drain electrode of the data strobe transistor T3 is electrically coupled to the source electrode of the compensating transistor T1, the source electrode of the data strobe transistor T3 is electrically coupled to the data signal Data, and the gate of the data strobe transistor T3 is electrically coupled to the first scanning signal Sn. The gate of the compensating transistor T1 is electrically coupled to the gate of the driving transistor T2 through the first node N1, and the drain electrode of the compensating transistor T1 is electrically coupled to the source electrode of the switching transistor T5. The drain electrode of the switching transistor T5 is electrically coupled to the gate of the compensating transistor T1, and the gate of the switching transistor T5 is electrically coupled to the first scanning signal Sn.

In the driving unit, the source electrode of the isolating transistor T8 is coupled to the external power supply ELVDD, the gate of the isolating transistor T8 is coupled to the first control signal En, and the drain electrode of the isolating transistor T8 is electrically coupled to the source electrode of the driving transistor T2. The drain electrode of the driving transistor T2 is coupled to the source electrode of the light emitting control transistor T4. The drain electrode of the light emitting control transistor T4 is electrically coupled to the light emitting unit EL4, and the gate of the light emitting control transistor T4 is coupled to the first control signal En.

In the initializing unit 5, the source electrode of the first initializing transistor T6 is coupled to the initializing voltage Vin, the drain electrode of the first initializing transistor T6 is electrically coupled to the first node N1, and the gate of the first initializing transistor T6 is electrically coupled to the second scanning signal Sn−1. The source electrode of the second initializing transistor T7 is coupled to the initializing voltage Vin, the drain electrode of the second initializing transistor T7 is electrically coupled to the light emitting unit EL4, and the gate of the second initializing transistor T7 is electrically coupled to the second scanning signal Sn−1.

The capacitor C3 is coupled between the first node N1 and the external power supply ELVDD.

According to the driving signal shown in FIG. 10, the driving method of the pixel circuit shown in FIG. 11 is as follows.

In the initializing stage, the first scanning signal Sn is at a high level, so that the data strobe transistor T3 and the switching transistor T5 are turned off and the compensating unit 1 is turned off. The first control signal En is at a high level, so that the light emitting control transistor T4 and the isolating transistor T8 are turned off and the driving unit 2 is turned off. The second control signal Sn−1 is at a low level, so that the first initializing transistor T6 and the second initializing transistor T7 are turned on. The first initializing transistor T6 transmits the initializing voltage Vin to the first node N1, so that the first node N1 is initialized. The second initializing transistor T7 transmits the initializing voltage Vin to the light emitting unit EL4, so that the light emitting unit EL4 is initialized.

In the data writing stage, the first scanning signal Sn is at a low level, so that the data strobe transistor T3 and the switching transistor T5 are turned on and the compensating unit 1 is turned on. The first control signal En is at a high level, so that the light emitting control transistor T4 and the isolating transistor T8 are turned off and the driving unit 2 is turned off. The second scanning signal Sn−1 is at a high level, so that the first initializing transistor T6 and the second initializing transistor T7 are turned off, and the initializing unit 5 is turned off. The data signal Data is transmitted to the source electrode of the compensating transistor T1 via the data strobe transistor T3. Since the switching transistor T5 is turned on, the compensating transistor T1 is operated in the saturation region, and the data signal Data is written into the first node N1 until the voltage of the first node N1 is the first voltage ($V_{data}+V_{thT1}$), and then the compensating transistor T1 is turned off.

In the light emitting stage, the first scanning signal Sn is at a high level, so that the data strobe transistor T3 and the switching transistor T5 are turned off, and the compensating unit 1 is turned off. The first control signal En is at a low level, so that the light emitting control transistor T4 and the isolating transistor T8 are turned on, and the driving unit 2 is turned on. The second scanning signal Sn−1 is at a high level, so that the first initializing transistor T6 and the second initializing transistor T7 are turned off, and the initializing unit 5 is turned off. The driving transistor T2 generates a driving current to drive the light emitting unit EL4 to emit light. Since the voltage of the first node N1 is the first voltage ($V_{data}+V_{thT1}$), the gate voltage of the driving transistor T2 can be compensated by the threshold so that the driving current is no longer affected by the threshold drift of the driving transistor T2.

In the above embodiment, the following points should be specifically noted.

(1) The second initializing transistor T7 may also be coupled to the first scanning signal or a third scanning signal, so that the initializing of the first node N1 and the initializing of the light emitting unit EL4 may not be simultaneously performed, thereby preventing the pixel circuit or a power supply circuit for powering the pixel circuit from being damaged by an excessive instantaneous current due to the initializing voltage Vin when the first node N1 and the light emitting unit EL4 are initialized simultaneously.

(2) The compensating unit in FIG. 11 may also include only the compensating transistor T1 and the switching transistor T5 while omitting the data strobe transistor T3, or may only include the compensating transistor T1 and the data strobe transistor T3 while omitting the switching transistor T5, so that the compensating unit includes at least one of the switching transistor T5 and the data strobe transistor T3.

(3) The first initializing transistor T6 and the second initializing transistor T7 in the initializing unit may also be coupled in the following modes. That is, the first electrode of the first initializing transistor T6 is electrically coupled to the first node N1, and the gate of the first initializing transistor T6 is coupled to the second scanning signal Sn−1, and the second electrode of the first initializing transistor T6 is electrically coupled to the light emitting unit EL4; the first electrode of the second initializing transistor T7 is electrically coupled to the light emitting unit EL4, the second electrode of the second initializing transistor T7 is coupled to the initializing voltage Vin, and the gate of the second initializing transistor T7 is coupled to the second scanning signal Sn−1; the first initializing transistor T6 and the second initializing transistor T7 are the same double-gate transistor, which is used instead of the original transistors T6 and T7, so that the number of transistors in the pixel circuit is reduced, thereby simplifying the circuit.

Based on the same technical idea, the embodiments of the present disclosure provide a pixel structure, which is suitable for any one of the above pixel circuits. The pixel circuit provided by the embodiments of the present disclosure includes a first electrode region, a second electrode region, a third electrode region and a fourth electrode region disposed separately, a common gate region in contact with the first electrode region, the second electrode region, the third electrode region and the fourth electrode region respectively, a third electrode extending region extending from the third electrode region, and a fourth electrode extending region extending from the fourth electrode region. The common gate region, the first electrode region and the second electrode region form the compensating transistor. The common gate region, the third electrode region and the fourth electrode region form the driving transistor. An overlapping region of the third electrode extending region and a first control signal line forms a gate region of the isolating transistor, and a side of the third electrode extending region away from the common gate region is coupled to an external power supply line. An overlapping region of the fourth electrode extending region and the first control signal line forms a gate region of the light emitting control transistor, and a side of the fourth electrode extending region away from the common gate region is coupled to the light emitting unit.

Figure 12:
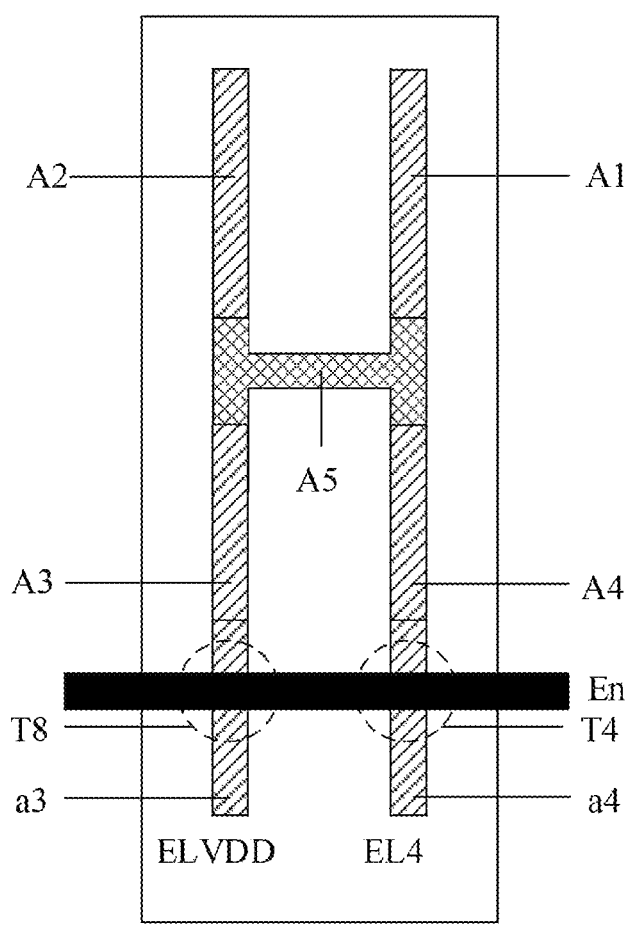
FIG. 12 is a schematic diagram of a pixel structure provided by an embodiment of the present disclosure.

FIG. 12 is a schematic diagram of a pixel structure provided by an embodiment of the present disclosure. As shown in FIG. 12, the pixel structure includes a first electrode region A1, a second electrode region A2, a third electrode region A3 and a fourth electrode region A4 disposed separately, a common gate region A5 in contact with the first electrode region A1, the second electrode region A2, the third electrode region A3 and the fourth electrode region A4, a third electrode extending region a3 extending from the third electrode region A3, and a fourth electrode extending region a4 extending from the fourth electrode region A4. The common gate region A5, the first electrode region A1 and the second electrode region A2 form the compensating transistor T1. The common gate region A5, the third electrode region A3 and the fourth electrode region A4 form the driving transistor T2. An overlapping region of the third electrode extending region a3 and a first control signal line En forms a gate region of the isolating transistor T8, and a side of the third electrode extending region a3 away from the common gate region A5 is coupled to an external power supply line ELVDD. An overlapping region of the fourth electrode extending region a4 and the first control signal line En forms a gate region of the light emitting control transistor T4, and a side of the fourth electrode extending region a4 away from the common gate region A5 is coupled to the light emitting unit EL4.

It should be understood that each of the electrode regions and the extending region coupled to the same may be formed integrally, and there is no substantial boundary therebetween. And different terms are used only for convenience of description.

When the pixel structure as shown in FIG. 12 is applied to the pixel circuit as shown in FIG. 3, in the data writing stage, the data signal is written into the common gate region A5. Since in this case, the isolating transistor T8 is turned off by the first control signal En, the external power supply ELVDD signal is not written into the common gate region A5, thereby avoiding the influence of the external power supply ELVDD signal on the data signal Data when the compensating transistor T1 and the driving transistor T2 are common gate region transistors.

Figure 13:
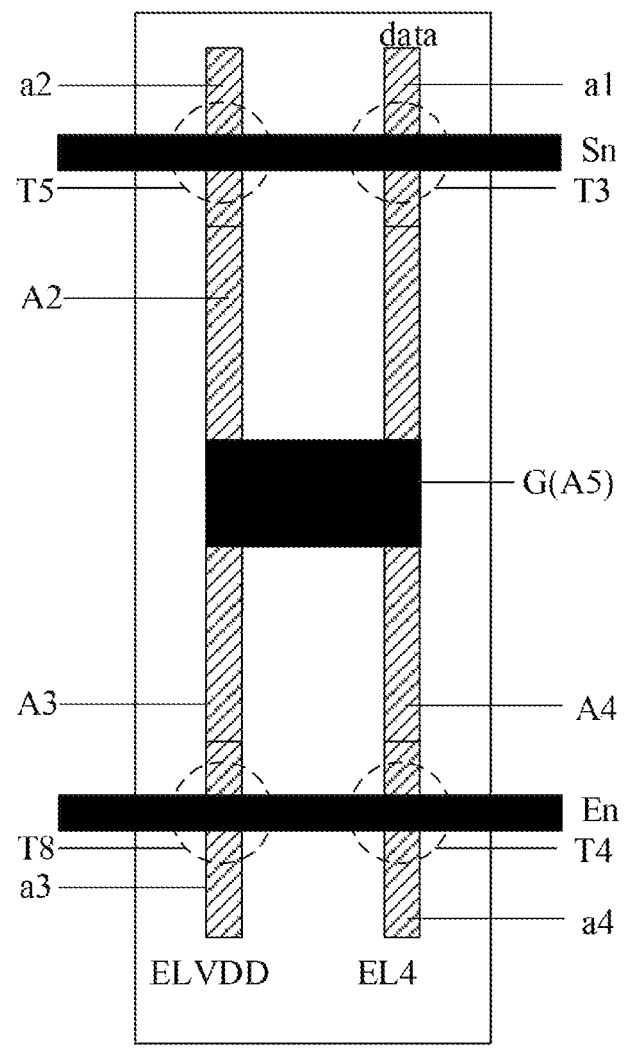
FIG. 13 is a schematic diagram of a feasible pixel structure provided by an embodiment of the present disclosure.

In an embodiment, FIG. 13 is a schematic diagram of a feasible pixel structure provided by an embodiment of the present disclosure. As shown in FIG. 13, a metal plate G is disposed above the common gate region A5. The common gate region A5 and the metal plate G are coupled with an insulating layer. The metal plate G is a common gate of the compensating transistor T1 and the driving transistor T2. Further, the metal plate G may also be one of the capacitance plates of the capacitor C3 in the pixel circuit provided by the embodiment of the present disclosure. The metal plate G serves as both of the common gate of the compensating transistor T1 and the driving transistor T2 and one of the capacitance plates of the capacitor C3, which simplifies the pixel structure.

In an embodiment, as shown in FIG. 13, the pixel structure further includes a first electrode extending region a1 extending from the first electrode region A1, an overlapping region of the first electrode extending region a1 and the first scanning signal line Sn forms a gate region of the data strobe transistor T3, and a side of the first electrode extending region a1 away from the common gate region A1 is coupled to a data signal line Data.

In an embodiment, as shown in FIG. 13, the pixel structure provided by the embodiment of the present disclosure further includes a second electrode extending region a2 extending from the second electrode region A2, an overlapping region of the second electrode extending region a2 and the first scanning signal line Sn forms a gate region of the switching transistor T5, and a side of the second electrode extending region a2 away from the common gate region A5 is electrically coupled to the metal gate G. In a specific implementation, the second electrode extending region a2 and the metal gate G may be electrically coupled through an upper layer metal interconnection. Specifically, the second electrode extending region a2 is electrically coupled to the upper layer metal interconnection through an interlayer metal interconnection, and the upper layer metal interconnection is returned to the metal layer where the metal gate G is located through the interlayer metal interconnection and is electrically coupled to the metal gate G.

In the data writing stage, the data strobe transistor T3 and the switching transistor T5 are controlled to be turned on by the first scanning signal line Sn, and at the same time, and the isolating transistor T8 and the light emitting control transistor T4 are controlled to be turned off by the first control signal line En. The data signal Data is written into the common gate region A5 through the second electrode extending region a2 and the second electrode region A2. Since the isolating transistor T8 is turned off at this time, the external power supply signal ELVDD cannot be input into the common gate region A5, thereby avoiding the influence of the external power supply signal ELVDD on the data signal Data.

In the light emitting stage, the data strobe transistor T3 and the switching transistor T5 are controlled to be turned off by the first scanning signal line Sn, and at the same time, the isolating transistor T8 and the light emitting control transistor T4 are controlled to be turned on by the first control signal line En. The external power supply signal ELVDD is applied to the common gate region through the third electrode extending region a3 and the third electrode region A3, so that a driving current is generated and is transmitted to the light emitting unit EL4 along the fourth electrode region A4 and the fourth electrode extending region a4 to drive the light emitting unit EL4 to emit light.

It should be understood that the pixel structure provided by the embodiment of the present disclosure is not a complete pixel structure, and some of the pixel structures not shown in the present disclosure can be implemented according to the related art, which are not described in details herein. However, any of the technical solutions including the pixel structures disclosed in the embodiments of the present disclosure should be included in the embodiments of the present disclosure.

Figure 14:
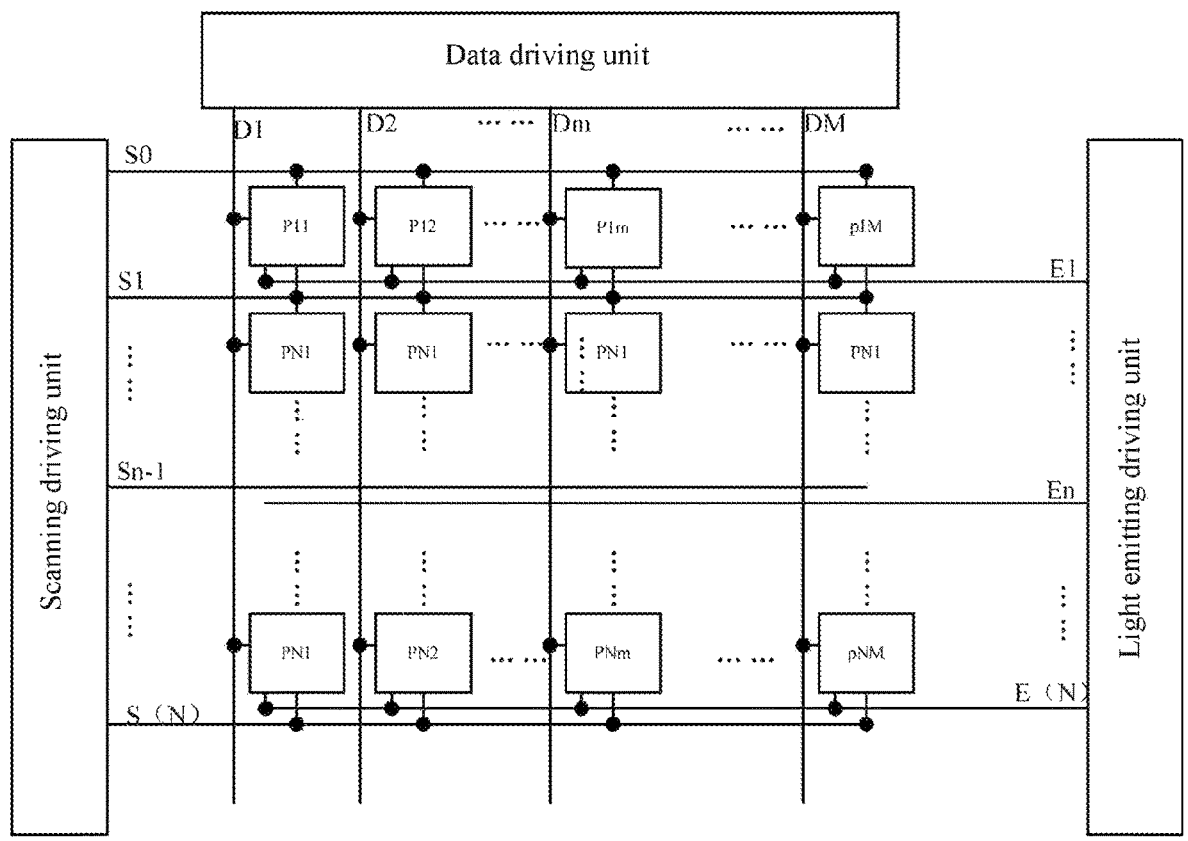
FIG. 14 is a schematic diagram of a display structure provided by an embodiment of the present disclosure.

Based on the same technical idea, the embodiments of the present disclosure provide a display, which uses the pixel circuit provided by any one of the above embodiments. FIG. 14 is a schematic diagram of a display structure provided by an embodiment of the present disclosure. As shown in FIG. 14, the display includes a N×M pixel circuit array. A scanning driving unit generates scanning signals S0, S1, S2, . . . , SN, where Sn is the scanning signal input by the scanning driving unit to the n-th row of pixels, and n=1, 2, . . . , N. A data driving unit generates M data signals Data of D1, D2, . . . , DM, which correspond to M columns of pixels respectively, where Dm is the data signal Data of the m-th column of pixels, and m=1, 2, . . . , M. A light emitting driving unit generates first control signals E1, E2, . . . , EN, En is the first control signal input by the light emitting driving unit to pixels in the n-th row, wherein n=1, 2, . . . , N.

Based on the above, the embodiments of the present disclosure provide a pixel circuit, a driving method, a pixel structure and a display panel. The pixel circuit includes a compensating unit, a driving unit, a light emitting unit, a capacitor, and an external power supply. The compensating unit is electrically coupled to the driving unit through a first node, the external power supply, the driving unit and the light emitting unit are coupled in series sequentially, and the capacitor is coupled between the first node and the external power supply. The compensating unit is used to receive a data signal and a first scanning signal, and to set a voltage of the first node to a first voltage under the control of the first scanning signal, and the first voltage is obtained by compensating for a voltage of the data signal through a compensating transistor in the compensating unit. The capacitor is used to maintain the first node at the first voltage. The driving unit includes an isolating transistor, a driving transistor and a light emitting control transistor coupled between the external power supply and the light emitting unit in series sequentially through their source and drain electrodes. Both gates of the light emitting control transistor and the isolating transistor receive a first control signal, and the driving transistor and the compensating transistor are transistors with common gate region. The driving transistor is used to generate a driving current to drive the light emitting unit to emit light when the isolating transistor and the light emitting control transistor are turned on under the control of the first control signal, and the driving current is obtained according to the first voltage, a voltage of the external power supply, and a threshold voltage of the driving transistor in the driving unit. The compensating unit is coupled to the data signal, and the driving unit is coupled to the external power supply, so that in the data writing stage, the data signal is compensated for by the compensating transistor in the compensating unit, and the threshold voltage of the compensating transistor is compensated to the voltage of the data signal to obtain the first voltage. Since the compensating unit is not coupled to the external power supply, the influence of the external power supply on the data signal is avoided. Moreover, the driving transistor and the compensating transistor are common-gate region transistors, both of which have almost the same threshold voltage, and thus the compensating the threshold voltage of the compensating transistor to the voltage of the data signal corresponds to compensating the threshold voltage of the driving transistor to the voltage of the data signal, which ensures the threshold compensating function of the pixel circuit. At the same time, due to the isolating transistor, even if the compensating transistor and the driving transistor are the common-gate region transistors, the data signal will not be affected by the external power supply in the common-gate region during data writing, which further improves the light emitting stability of the light emitting transistor. Therefore, the embodiments of the present disclosure may achieve the threshold compensating function of the pixel circuit while avoiding the influence of the external power supply on the data signal and improving the light-emitting stability of the light emitting diode.

Although the preferred embodiments of the present disclosure have been described, those skilled in the art can make further changes and modifications to these embodiments once they learn the basic inventive concept. Therefore, the appended claims are intended to be interpreted as including the preferred embodiments and all changes and modifications that fall within the scope of the present disclosure.

It will be apparent to those skilled in the art that various modifications and variations can be made in the present disclosure without departing from the spirit and scope of the present disclosure. Thus, if these modifications and variations of the present disclosure fall within the scope of the claims of the present disclosure and their equivalents, the present disclosure is also intended to include these modifications and variations.

What is claimed is:

1. A pixel circuit, comprising a compensating unit, a driving unit, a light emitting unit, a capacitor, and an external power supply, wherein the compensating unit is electrically coupled to the driving unit through a first node, the external power supply, the driving unit and the light emitting unit are coupled in series sequentially, and the capacitor is coupled between the first node and the external power supply;

the compensating unit is configured to receive a data signal and a first scanning signal, and to set a voltage of the first node to a first voltage under the control of the first scanning signal, wherein the first voltage is obtained by compensating for a voltage of the data signal through a compensating transistor in the compensating unit;

the capacitor is configured to maintain the voltage of the first node at the first voltage;

the driving unit comprises an isolating transistor, a driving transistor and a light emitting control transistor coupled between the external power supply and the light emitting unit in series sequentially through their source and drain electrodes;

both gates of the light emitting control transistor and the isolating transistor are configured to receive a first control signal, and the driving transistor and the compensating transistor are transistors with common gate region; and the driving transistor is configured to generate a driving current to drive the light emitting unit to emit light when the isolating transistor and the light emitting control transistor are turned on under the control of the first control signal, wherein the driving current is obtained according to the first voltage, a voltage of the external power supply, and a threshold voltage of the driving transistor in the driving unit, wherein the compensating transistor is formed by the common gate region, a first electrode region and a second electrode region, the driving transistor is formed by the common gate region, a third electrode region and a fourth electrode region, the first electrode region, the second electrode region, the third electrode region and the fourth electrode region are disposed separately and are in contact with the common gate region, and the common gate region is disposed between the first electrode and the second electrode of the compensating transistor and the third electrode and the fourth electrode of the driving transistor to be shared by the compensating transistor and the driving transistor.

2. The pixel circuit according to claim 1, wherein the compensating unit further comprises a data strobe transistor, and the data strobe transistor comprises a first electrode receiving the data signal, a second electrode electrically coupled to a first electrode of the compensating transistor, and a gate electrically coupled to the first scanning signal.

3. The pixel circuit according to claim 2, wherein the compensating unit further comprises a switching transistor, and the switching transistor comprises a first electrode electrically coupled to a second electrode of the compensating transistor, a second electrode electrically coupled to a gate of the compensating transistor, and a gate electrically coupled to the first scanning signal.

4. The pixel circuit according to claim 1, further comprising an initializing unit coupled between the first node and the light emitting unit, wherein the initializing unit is configured to receive a second scanning signal and an initializing signal, and to initialize the first node and the light emitting unit with the initializing signal under the control of the second scanning signal.

5. A driving method of a pixel circuit, applied to the pixel circuit according to claim 1, comprising:

in a data writing stage, controlling the first scanning signal to turn on the compensating unit so that the compensating unit sets the voltage of the first node to the first voltage, and controlling the first control signal to turn off the isolating transistor and the light emitting control transistor so that the light emitting unit does not emit light, and the capacitor maintains the voltage of the first node at the first voltage, wherein the first voltage is obtained by compensating for the voltage of the data signal through the compensating transistor in the compensating unit; and in a light emitting stage, controlling the first scanning signal to turn off the compensating unit, and controlling the first control signal to turn on the insolating transistor and the light emitting transistor, so that the driving transistor generates a driving current to drive the light emitting unit to emit light, wherein the driving current is obtained according to the first voltage, the voltage of the external power supply and the threshold voltage of the driving transistor, and the capacitor is in a maintaining state.

6. The method according to claim 5, wherein the pixel circuit further comprises an initializing unit, which is coupled between the first node and the light emitting unit, and is configured to receive a second scanning signal and an initializing signal, wherein the method further comprises:

before the data writing stage, in an initializing stage, controlling the second scanning signal to turn on the initializing unit, so that the initializing unit initializes the first node and the light emitting unit with an initializing voltage and the capacitor maintains the initializing voltage, controlling the first scanning signal to turn off the compensating unit, and controlling the first control signal to turn off the driving unit.

7. The method according to claim 6, further comprising:

in the data writing stage, controlling the second scanning signal to turn off the initializing unit; and in the light emitting stage, controlling the second scanning signal to turn off the initializing unit.

8. A pixel structure of the pixel circuit according to claim 1, comprising:

a first electrode region, a second electrode region, a third electrode region and a fourth electrode region disposed separately, a common gate region in contact with the first electrode region, the second electrode region, the third electrode region and the fourth electrode region respectively, a third electrode extending region extending from the third electrode region, and a fourth electrode extending region extending from the fourth electrode region, wherein the common gate region, the first electrode region and the second electrode region form the compensating transistor, the common gate region, the third electrode region and the fourth electrode region form the driving transistor, an overlapping region of the third electrode extending region and a first control signal line forms a gate region of the isolating transistor, and a side of the third electrode extending region away from the common gate region is coupled to an external power supply line, an overlapping region of the fourth electrode extending region and the first control signal line forms a gate region of the light emitting control transistor, and a side of the fourth electrode extending region away from the common gate region is coupled to the light emitting unit, and the common gate region is disposed between the first electrode and the second electrode of the compensating transistor and the third electrode and the fourth electrode of the driving transistor to be shared by the compensating transistor and the driving transistor.

9. The pixel structure according to claim 8, wherein a metal plate is disposed above the common gate region, and used as one of capacitance plates of the capacitor.

10. The pixel structure according to claim 8,
wherein the compensating unit further comprises a data strobe transistor, and the data strobe transistor comprises a first electrode receiving the data signal, a second electrode electrically coupled to a first electrode of the compensating transistor, and a gate electrically coupled to the first scanning signal,
wherein the pixel structure further comprises a first electrode extending region extending from the first electrode region, an overlapping region of the first electrode extending region and the first scanning signal line forms a gate region of the data strobe transistor, and a side of the first electrode extending region away from the common gate region is coupled to a data signal line.

11. The pixel structure according to claim 10,
wherein the compensating unit further comprises a switching transistor, and the switching transistor comprises a first electrode electrically coupled to a second electrode of the compensating transistor, a second electrode electrically coupled to a gate of the compensating transistor, and a gate electrically coupled to the first scanning signal
wherein the pixel structure further comprises a second electrode extending region extending from the second electrode region, an overlapping region of the second electrode extending region and the first scanning signal line forms a gate region of the switching transistor, and a side of the second electrode extending region away from the common gate region is electrically coupled to the common gate region.

12. A display panel, comprising the pixel structure according to claim 8.

13. The display panel according to claim 12, wherein a metal plate is disposed above the common gate region, and used as one of capacitance plates of the capacitor.

14. The display panel according to claim 12,
wherein the compensating unit further comprises a data strobe transistor, and the data strobe transistor comprises a first electrode receiving the data signal, a second electrode electrically coupled to a first electrode of the compensating transistor, and a gate electrically coupled to the first scanning signal,
wherein the pixel structure further comprises a first electrode extending region extending from the first electrode region, an overlapping region of the first electrode extending region and the first scanning signal line forms a gate region of the data strobe transistor, and a side of the first electrode extending region away from the common gate region is coupled to a data signal line.

15. The display panel according to claim 14,
wherein the compensating unit further comprises a switching transistor, and the switching transistor comprises a first electrode electrically coupled to a second electrode of the compensating transistor, a second electrode electrically coupled to a gate of the compensating transistor, and a gate electrically coupled to the first scanning signal
wherein the pixel structure further comprises a second electrode extending region extending from the second electrode region, an overlapping region of the second electrode extending region and the first scanning signal line forms a gate region of the switching transistor, and a side of the second electrode extending region away from the common gate region is electrically coupled to the common gate region.

* * * * *